(12) United States Patent
Fan et al.

(10) Patent No.: US 8,240,029 B2
(45) Date of Patent: Aug. 14, 2012

(54) METHOD FOR FORMING AN ISOLATED INNER LEAD FROM A LEADFRAME

(75) Inventors: Wen-Jeng Fan, Hsinchu (TW); Yu-Mei Hsu, Hsinchu (TW)

(73) Assignee: Powertech Technology Inc., Hsinchu (TW)

( * ) Notice: Subject to any disclaimer, the term of this patent is extended or adjusted under 35 U.S.C. 154(b) by 937 days.

(21) Appl. No.: 12/274,694

(22) Filed: Nov. 20, 2008

(65) Prior Publication Data

US 2010/0122454 A1   May 20, 2010

(51) Int. Cl.
*H01R 43/00* (2006.01)
*H01R 43/16* (2006.01)

(52) U.S. Cl. ............ 29/827; 174/529; 174/536; 438/123

(58) Field of Classification Search .................. 29/827; 438/123; 174/536, 529
See application file for complete search history.

(56) References Cited

U.S. PATENT DOCUMENTS 6,104,083 A * 8/2000 Ito ............................. 257/666

* cited by examiner

*Primary Examiner* — Livius R Cazan
(74) *Attorney, Agent, or Firm* — Muncy, Geissler, Olds & Lowe, PLLC

(57) ABSTRACT

A method for forming an isolated inner lead from a leadframe is revealed. The leadframe primarily comprises a plurality of leads, the isolated inner lead, and an external lead. Each lead has an inner portion having a finger. The isolated inner lead having two fingers is completely formed inside a molding area and is made of the same metal leadframe as the leads. One finger of the isolated inner lead and the fingers of the leads are linearly arranged. The other finger of the isolated inner lead is adjacent to a finger of the external lead. At least one of the inner portions divides the isolated inner lead from the external lead. The isolated inner lead is integrally connected to an adjacent one of the inner portions by a connecting block. A tape-attaching step is performed to mechanically connect the isolated inner lead where two insulating tapes are attached in a manner that the connecting block can be removed. Therefore, the isolated inner lead is electrically isolated from the leads and can be mechanically fixed to replace extra redistributing components during semiconductor packaging processes.

20 Claims, 7 Drawing Sheets

METHOD FOR FORMING AN ISOLATED INNER LEAD FROM A LEADFRAME

FIELD OF THE INVENTION

The present invention relates generally to manufacturing a leadframe for semiconductor packages, especially to a method for forming an isolated inner lead from a leadframe.

BACKGROUND OF THE INVENTION

Leadframes used in semiconductor packages as chip carriers are patterned metal sheets including a plurality of metal leads, which have the advantages of lower packaging costs where chips are attached on leadframes and then are encapsulated by encapsulants. The semiconductor packages are mounted to external printed circuit boards through the external portions of the leads of leadframes. In order to form encapsulants by molding, the leads of leadframe are extended outside the molding area to be clamped by top and bottom mold tools. Moreover, leadframes are normally made by either etching or punching a metal sheet to form a plurality of leads.

Since the leads are formed from the same layer of a leadframe, the sequence of the leads is fixed and can not be changed for different pin assignments. Therefore, various methods have been disclosed to enable electrical paths from bonding pads of a chip to leads of leadframes to reroute pin assignments without being constrained by the sequent nature of the leads such as combining two leadframes, attaching a thin-film circuit on the active surface of a chip, or disposing electrically redistributing components, such as conductive bumps, redistributed traces, or comb-like conductive leads, on die-attaching tapes. However, there are extra costs to deposit a second leadframe or internal redistributing components on specific locations so that the packaging processes become more complicated with higher risks of exposing bonding wires from the encapsulant where package thickness is also increased. Moreover, the non-chip bonding ends of bonding wires will cause wire bonding height differences and displacement leading to constant adjusting of wire bonding parameters.

SUMMARY OF THE INVENTION

The main purpose of the present invention is to provide a method for forming an isolated inner lead from a leadframe where the isolated inner leads are electrically isolated from the leads of a leadframe for completely encapsulating in an encapsulant to achieve redistribution of pin assignments and electrical paths without disposing extra internal redistributing components for wire bonding and to avoid wire-bonding height differences and displacement at non-chip bonding points.

The second purpose of the present invention is to provide a method for forming an isolated inner lead from a leadframe. The leadframe having the isolated inner lead are configured for fabricating Chip-On-Lead (COL) packages to reroute pin assignments without increasing the package heights, especially for multi-chip COL packages.

According to the present invention, the method for forming an isolated inner lead from a leadframe is disclosed. A molding area and a die-attaching area disposed inside the molding area are defined on the leadframe. The leadframe primarily comprises a plurality of leads, at least a predetermined isolated inner lead and an external lead. Each lead has an inner portion disposed inside the molding area and an external portion extended outside the molding area with integrally connected to the inner portion, wherein the inner portion has a first bonding finger. The isolated inner lead is completely located inside the molding area and formed from the same metal layer with the inner portions. The isolated inner lead has a second bonding finger and a third bonding finger formed at two opposing ends thereof where the first bonding fingers and the second bonding finger are linearly arranged. The external lead is extended outside the molding area and further partially formed inside the molding area to have a fourth bonding finger adjacent to the third bonding finger. Additionally, at least one of the inner portions divides the third bonding finger of the isolated inner lead from the fourth bonding finger of the external lead for electrically isolating the isolated inner lead and the external lead. The leadframe before semiconductor packaging processes further comprises a connecting block disposed inside the die-attaching area and formed from the same metal layer with the inner portions to integrally connect the isolated inner lead to an adjacent one of the inner portions. A tape-attaching step is performed where a first insulating tape and a second insulating tape are attached to the leadframe so that the isolated inner leads and the inner portions are mechanically connected together. The first insulating tape is disposed inside the molding area adjacent to the first bonding fingers and the second bonding finger. The second insulating tape is disposed inside the molding area adjacent to the third bonding finger and the fourth bonding finger. After the tape-attaching step, the connecting block is removed to make the isolated inner lead electrically isolated from the adjacent inner portion.

The method for forming an isolated inner lead from a leadframe revealed according to the present invention has the following advantages and functions:

1. The leadframe having the isolated inner lead can achieve redistribution of pin assignments and electrical paths with the isolated inner lead and the inner portions of normal leads located inside the molding area in the same metal layer, and with the arrangements of leads, and with the disposition of a plurality of insulating tapes without disposing extra internal redistributing components for wire bonding and to avoid wire-bonding height differences and displacement at non-chip bonding points. Furthermore, the isolated inner lead is electrically isolated and mechanically fixed in the molding area.

2. The leadframe having the isolated inner lead can be implemented for Chip-On-Lead (COL) packages where the isolated inner leads are extended through the die-attaching area and made both ends of the bonding fingers located outside the die-attaching area to reroute pin assignments without increasing the package heights, especially for multi-chip COL package.

DETAILED DESCRIPTION OF THE INVENTION

Please refer to the attached drawings, the present invention is described by means of embodiments below.

Figure 2:
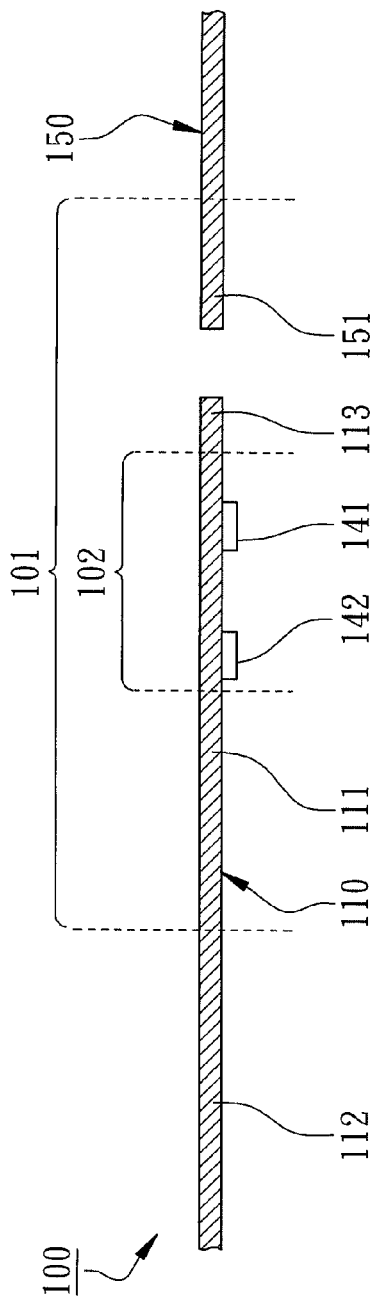
FIG. 2 is a cross-sectional view of the leadframe along a lead according to the first embodiment of the present invention.
Figure 3:
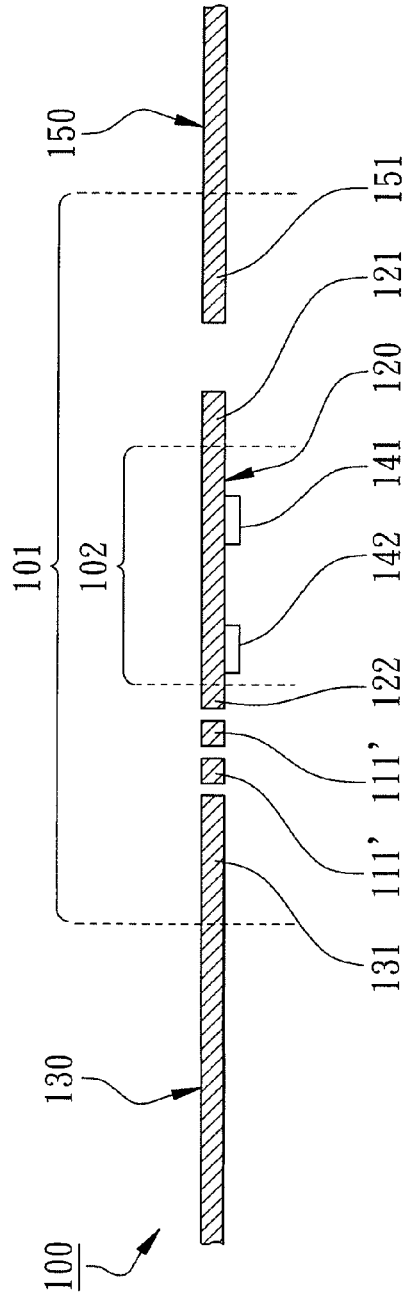
FIG. 3 is a cross-sectional view of the leadframe along an isolated inner lead and an external lead according to the first embodiment of the present invention.
Figure 6:
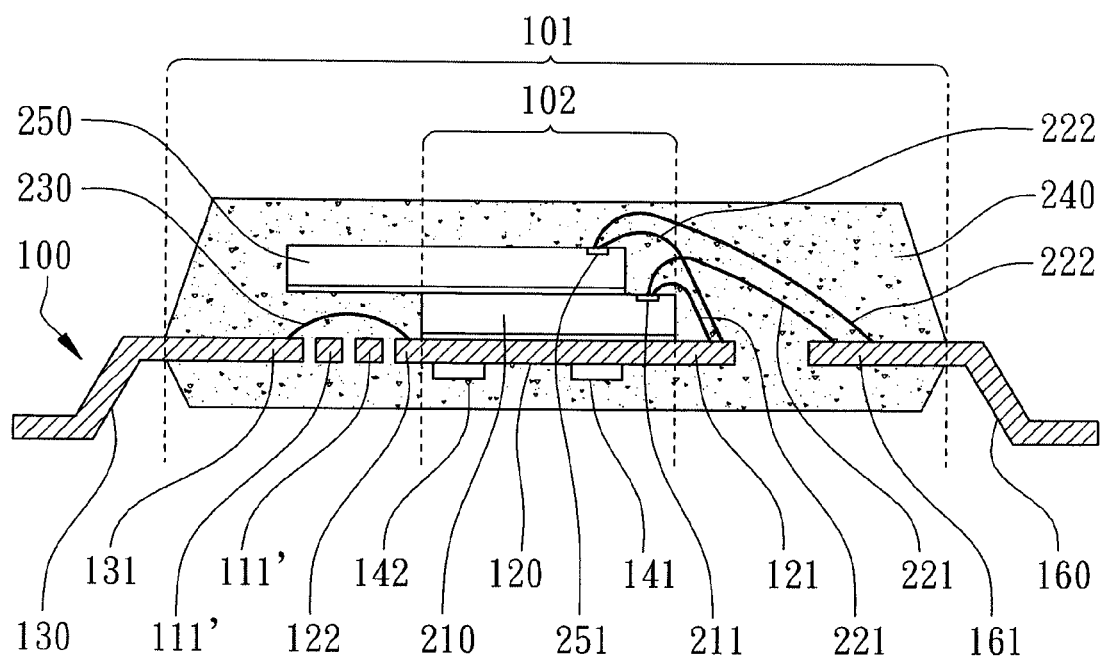
FIG. 6 is a cross-sectional view of a semiconductor package implemented the leadframe having isolated inner lead(s) along the isolated inner lead and the external lead according to the first embodiment of the present invention.

According to the first embodiment of the present invention, the method for forming an isolated inner lead from a leadframe is disclosed. The leadframe having isolated inner leads formed from the method is illustrated in FIG. 2 for a partial top view. A molding area 101 and a die-attaching area 102 are defined in the leadframe 100 where the die-attaching area 102 is disposed inside the molding area 101 corresponding to the footprint of an attached chip 210, as shown in FIG. 6, and the molding area 101 is an area corresponding to an encapsulant 240. The dimension of the molding area 101 is greater than the one of the die-attaching area 102 so that the encapsulant 240 can fully encapsulate the chip 210 or more chips. The leadframe 100 is a patterned metal sheet including a plurality of leads 110, at least an isolated inner lead 120 and at least an external lead 130. A first insulating tape 141 and a second insulating tape 142 are attached to the leadframe 100 for mechanically connecting the isolated inner lead 120 with the leads 110. A cross-sectional view along one of the leads of the leadframe 100 is shown in FIG. 2 and a cross-sectional view along the isolated inner lead 120 and the external lead 130 of the leadframe 100 is shown in FIG. 3. The leads 110, the isolated lead 120, and the external lead 130 are formed from the same layer of the leadframe 100 and made of the same metal which can be made of copper, iron, or its alloy. The first insulating tape 141 and the second insulating tape 142 are adhesive tapes which can be made of polyimide such as Kapton tapes.

The leads 110 have lead structures as a conventional leadframe where each lead 110 has an inner portion 111 inside the molding area 101 and an external portion 112 extended outside the molding area 101. A first bonding finger 113 is formed at the internal end of each inner portion 111. Therefore, the external portions 112 extended outside the molding area 101 are configured for external electrical connection and can be firmly clamped by the top and bottom mold tools during semiconductor packaging processes.

The isolated inner lead 120 is completely located inside the molding area 101 as an internal redistributing component for wire bonding only where the isolated internal lead 120 and the leads 110 are formed in the same metal leadframe so that there is no need for disposing extra redistributing components. A second bonding finger 121 and a third bonding finger 122 are formed at two opposing ends of the isolated inner lead 120 located inside the molding area 110. The second bonding finger 121 and the first bonding fingers 113 are linearly arranged. Normally, the isolated inner lead 120 is shorter than the inner portions 111 of the adjacent leads 110.

The external lead 130 is extended outside the molding area 101 for external electrical connections. The external lead 130 is further partially formed inside the molding area 101 to have a fourth bonding finger 131. The fourth bonding finger 131 located inside the molding area 101 is adjacent to the third bonding finger 122 for internal electrical connections to the isolated inner lead 120. Normally, the external lead 130 is longer than the external portion 112 of each leads 110.

Figure 1:
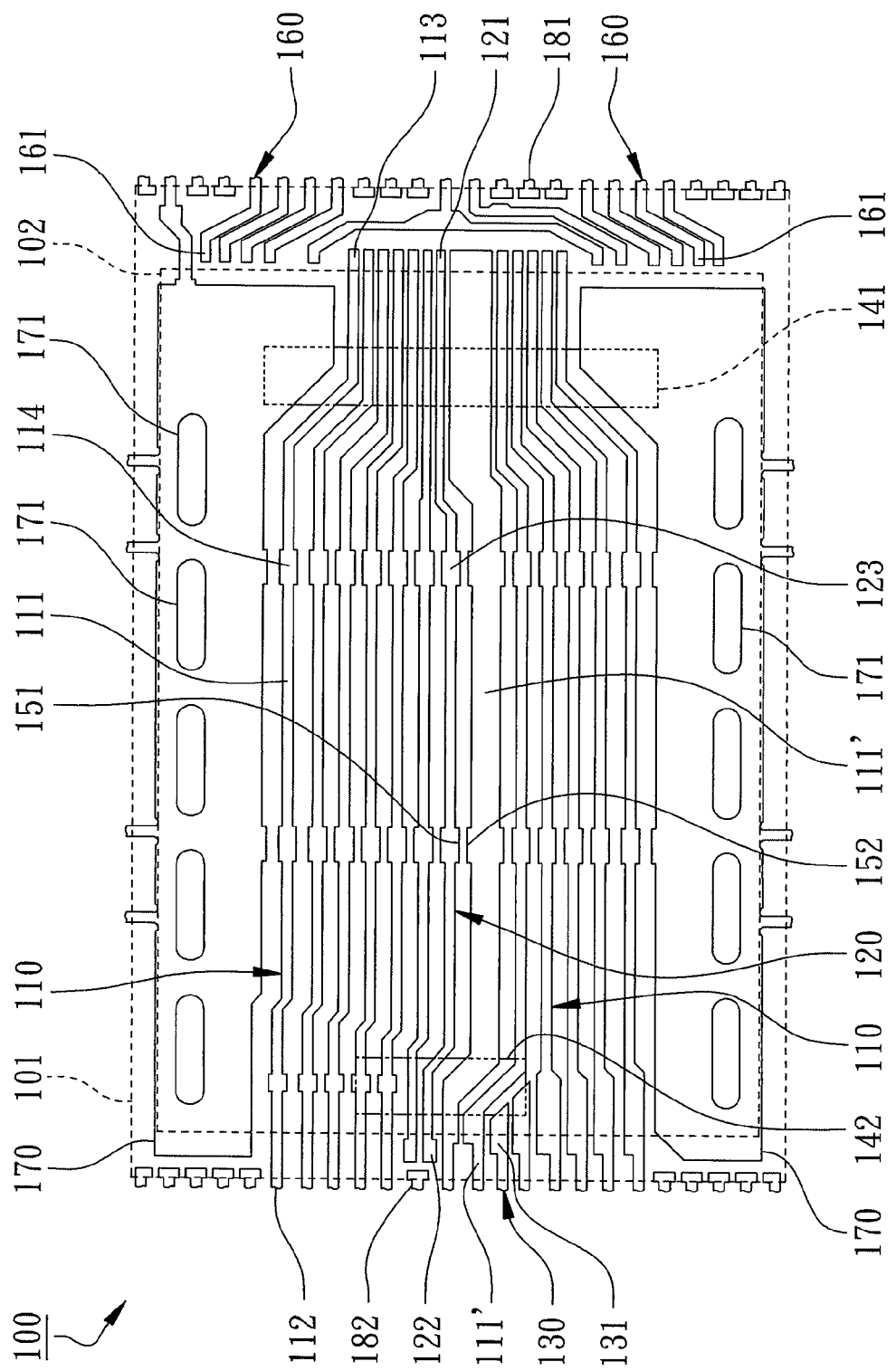
FIG. 1 is a partial top view of a leadframe having isolated inner lead(s) according to the first embodiment of the present invention.

At least one of the inner portions 111 has a specific location and is numbered 111'. The inner portion 111' is electrically isolated and formed between the isolated inner lead 120 and the external lead 130 to divide the third bonding finger 122 from the fourth bonding finger 131, as shown in FIG. 1 and FIG. 3. The first bonding fingers 113 and the second bonding finger 121 linearly arranged are configured for electrical connections to the chip by wire-bonding. The third bonding finger 122 and the fourth bonding finger 131 adjacent to each other are configured for short connections of rerouting pin assignments by wire-bonding as shown in FIG. 1.

During the method, the first insulating tape 141 and the second insulating tape 142 are attached to the isolated inner lead 120 and the inner portions 111 to electrically isolate and mechanically fix the isolated inner lead 120 where the first insulating tape 141 is attached inside the molding area 101 and close to the first bonding fingers 113 and the second bonding finger 121 as shown in FIG. 1. The second insulating tape 142 is also attached inside the molding area 101 and close to the third bonding finger 122 and the fourth bonding finger 131 as shown in FIG. 1. Therefore, the isolated inner lead 120 can be electrically isolated and mechanically fixed in the molding area 101 without firmly clamping by the top and bottom mold tools during semiconductor packaging processes. In this embodiment, the length of the second insulating tape 142 may be shorter than the one of the first insulating tape 141.

The isolated inner lead 120, the leads 110, and the external lead 130 are formed from the same layer of the leadframe 100 so as to form an integrated circuitry for rerouting pin assignments and electrical paths through the locations of the second bonding finger 121 and the third bonding finger 122 at two opposing ends of the isolated inner leads 120 and through the attachment of the first insulating tape 141 and the second insulating tape 142 without disposing extra internal redistributing components for wire bonding and to avoid wire-bonding height differences and displacement at non-chip bonding points.

Figure 4:
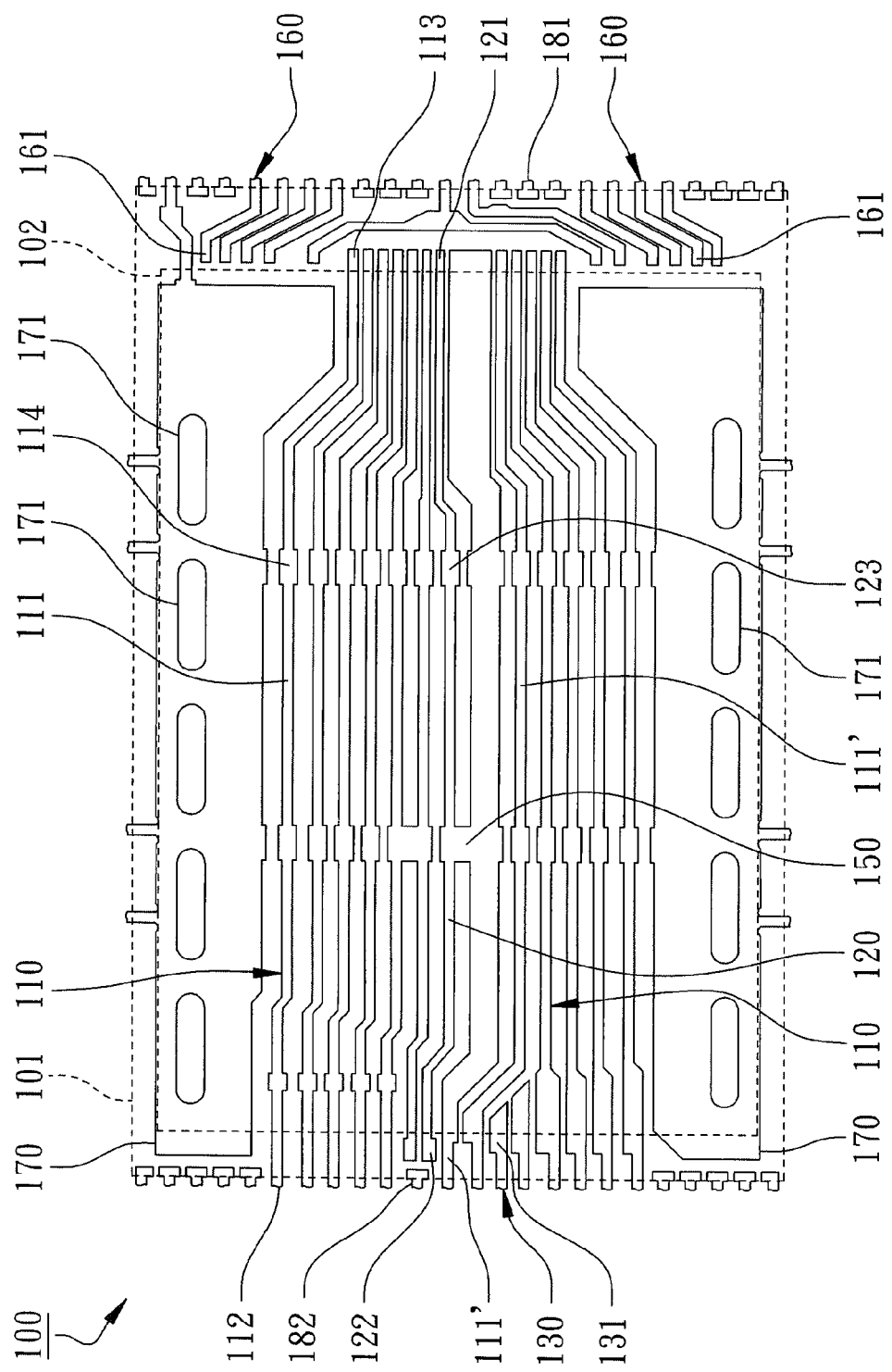
FIG. 4 is a partially top view of the leadframe having isolated inner lead(s) connected with connecting block(s) of a leadframe according to the first embodiment of the present invention.

As shown in FIG. 1, to be more specific, the isolated inner lead 120 has a first connecting residue 151 between the first insulating tape 141 and the second insulating tape 142. The inner portions 111' adjacent to the isolated inner lead 120 has a second connecting residue 152 which is corresponding to the first connecting residue 151. The connecting residue 151 and 152 are formed because that a connecting block 150 integrally connecting the isolated inner lead 120 with the inner portion 111' is removed, as shown in FIG. 4. The connecting block 150 is existed before the first insulating tape 141 and the second insulating tape 142 are attached to the leads 110 and the isolated inner lead 120.

Preferably, the leadframe 100 can be implemented in COL packages. As shown in FIG. 1, the first bonding finger 113 and the fourth bonding finger 131 are located outside the die-attaching area 102 since the isolated inner lead 120 can extend through the die-attaching area 102 with a certain length to make the second bonding finger 121 and the third bonding finger 122 located outside the die-attaching area 102. Therefore, the back surface of a chip can be attached to the leads 110 and to the isolated inner lead 120 without covering the first bonding fingers 113, the second bonding finger 121, the third bonding finger 122, nor the fourth bonding finger 131 where the first bonding fingers 113 and the second bonding finger 121 are the first bonding finger group and the third bonding finger 122 and the fourth bonding finger 131 are the second bonding finger group. Moreover, the first bonding finger group has different arranging area to the one of the second bonding finger group. In the present embodiment, the linear arrangement direction of the second bonding finger group can be parallel to the one of the first bonding finger group. Preferably, the first insulating tape 141 and the second insulating tape 142 can be disposed inside the die-attaching area 102 without occupying the limited area of the molding area 101 outside the die-attaching area 102 for disposing the bonding fingers. In a preferred embodiment, as shown in FIG. 1, the fourth bonding finger 131 can partially extend into the die-attaching area 102 so that the fourth bonding finger 131 can carry a chip as a small die pad. The second insulating tape 142 can further be attached to the fourth bonding finger 131 for mechanically connecting the external lead 130. Furthermore, the leadframe 100 further comprises a plurality of side supporting pads 170 disposed at two opposing sides of the inner portions 111 of the leads 110 where at least parts of or most of the edge supporting pads 170 are located inside the die-attaching area 102 to enhance chip carrying capabilities. Preferably, the side supporting pads 170 have a plurality of mold-flow through holes 171 to enhance filling of encapsulant to increase fixing strength connected with encapsulant.

In the present embodiment, the leadframe 100 further includes a plurality of short leads 160 shorter than the one of the leads 110. The short leads 160 do not extend to the die-attaching area 102 so as not to be designed for carrying chips. The internal ends 161 of the short leads 160 are disposed toward the first bonding fingers 113 and the second bonding finger 121 to increase the number of leads within the wire-bonding area.

There are several ways to enhance the mechanical locking of the leadframe 100. The widths of a certain section of the inner portions 111 within the die-attaching area 102 can be widened to form a plurality of first locking pads 114. The widths of a certain section of the isolated inner lead 120 within the die-attaching area 102 (under the first chip 210) can be widened to form a second locking pad 123. The first locking pads 114 and the second locking pad 123 can be linearly arranged to avoid peeling or shifting of the isolated inner lead 120 and the inner portions 111 inside the encapsulant 240. The leadframe 100 further includes at least a T-bar 181 or/and 182 located inside the molding area 101 but outside the die-attaching area 102. Each T-bar 181 or 182 is mechanically connected to a blank external lead to avoid peeling or shifting of blank external terminals.

Figure 5:
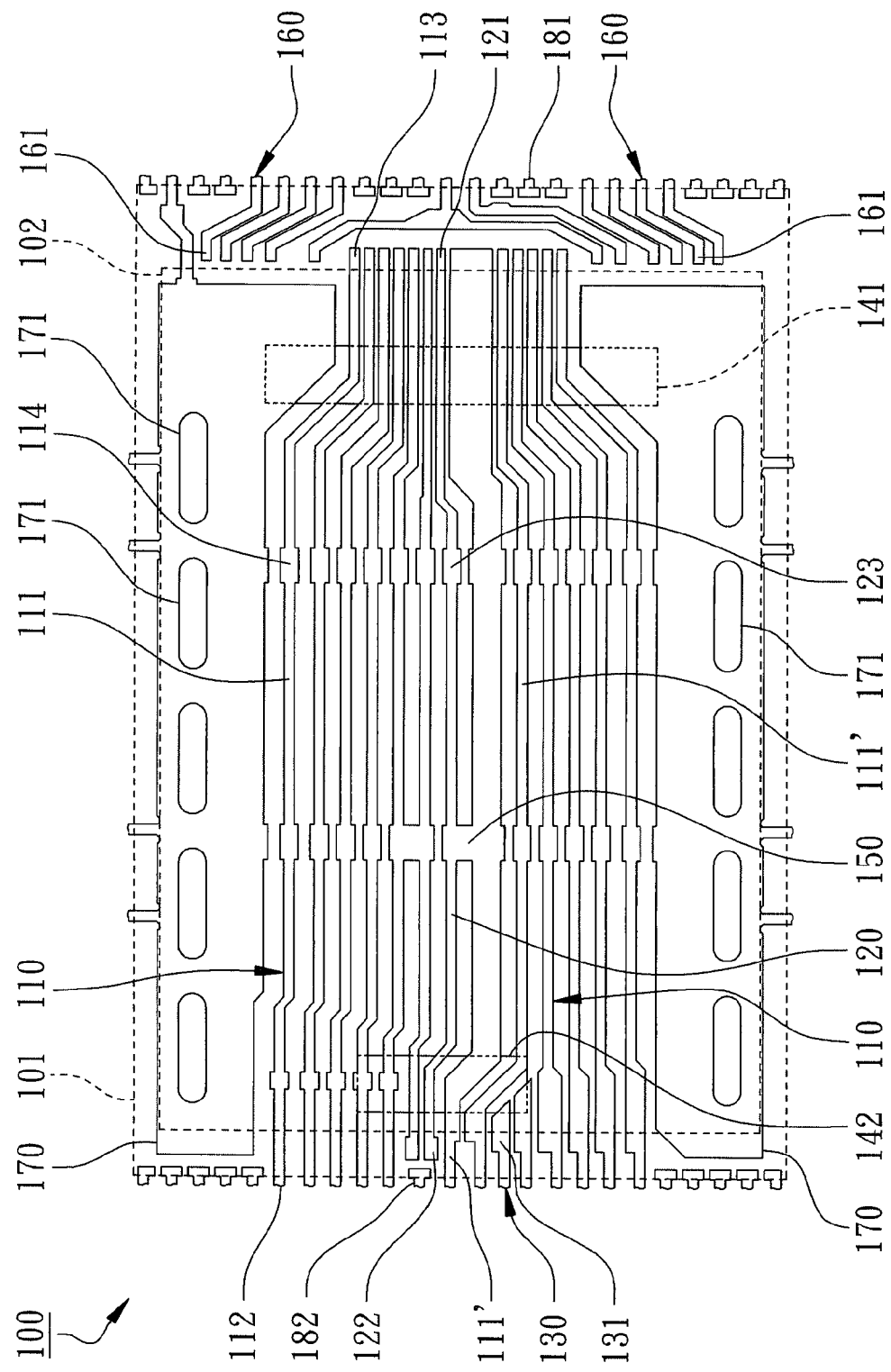
FIG. 5 is a partially top view of the leadframe having isolated inner lead(s) after tape-attaching and before removing the connecting block according to the first embodiment of the present invention.

Partial top views of the leadframe 100 mentioned above during the method according to the present invention are shown in FIG. 4 and FIG. 5. Firstly, the leadframe 100 is provided as shown in FIG. 4, which is formed by etching or by punching a metal plate, to form the leads 110, the isolated inner lead 120 before electrical isolation, the external lead 130, and the connecting block 150. The isolated inner lead 120 and the connecting block 150 are completely located inside the molding area 101 and formed from the same layer of the leadframe 100 with the leads 110. The connecting block 150 electrically and mechanically connect the isolated inner lead 120 with the inner portion 111' to ensure the corresponding positions of the isolated inner leads 120 without any shifting before attaching the insulating tapes. As shown in FIG. 5, then, a tape-attaching step is performed where the first insulating tape 141 and the second insulating tape 142 are attached to the leadframe 100 to mechanically fix the isolated inner lead 120. The first insulating tape 141 is located inside the molding area 101 close to the first bonding finger 113 and the second bonding finger 121 and the second insulating tape 142 is located inside the molding area 101 close to the third bonding finger 122 and the fourth bonding finger 131. Finally, the connecting blocks 150 is removed to make the isolated inner lead 120 to be electrically isolated to the inner portions 111. As shown in FIG. 5, the connecting blocks 150 is located between the first insulating tape 141 and the second insulating tape 142 so that the connecting blocks 150 can be removed by laser cutting, sawing or punching. As shown in FIG. 1, after removing the connecting blocks 150, isolated inner lead 120 has a first connecting residue 151 and the inner portion 111' adjacent to the isolated inner lead 120 has a second connecting residue 152 corresponding to the first connecting residue 152.

As shown in FIG. 6, the leadframe 100 can be implemented in COL packages, especially for multi-chip COL packages. A first chip 210 is aligned to the die-attaching area 102 with the back surface attached to the isolated inner lead 120 where the first chip 210 is also attached to the leads 110 within the die-attaching area 102 as shown in FIG. 1. The first bonding pads 211 of the chip 210 are electrically connected to the leadframe 100 by a plurality of first bonding wires 221 in a wire-bonding area, such as electrically connected to the first bonding fingers 113 of the leads 110, to the second bonding fingers 121 of the isolated inner leads 120, and to the internal ends 161 of the short leads 160. At least one jumping wire 230 is far away from the above-mentioned wire-bonding area of the first bonding wires 221 to electrically connect the third bonding fingers 122 of the isolated inner leads 120 to the fourth bonding fingers 131 of the external leads 130 overpassing the inner portion 111' to achieve rerouting pin assignments without increasing packaging heights nor disposing extra internal redistributing components for wire bonding. A second chip 250 can be stacked on top of the first chip 210 where the second bonding pads 251 of the second chip 250 are electrically connected to the leadframe 100 by a plurality of second bonding wires 222. When the first chip 210 and the second chip 250 are stepwise stacked, the jumping wire 230 can be hidden under the extrusion portion of the second chip 250. Therefore, an encapsulant 240 by molding is formed inside the molding area 101 to encapsulate the chips 210, 250, the inner portions 111 of the leads 110, the isolated inner leads 120, the bonding wires 221, 222, and the jumping wire 230 where the isolated inner leads 120 will be completely encapsulated without extending to the sides of the encapsulant 240.

Figure 7:
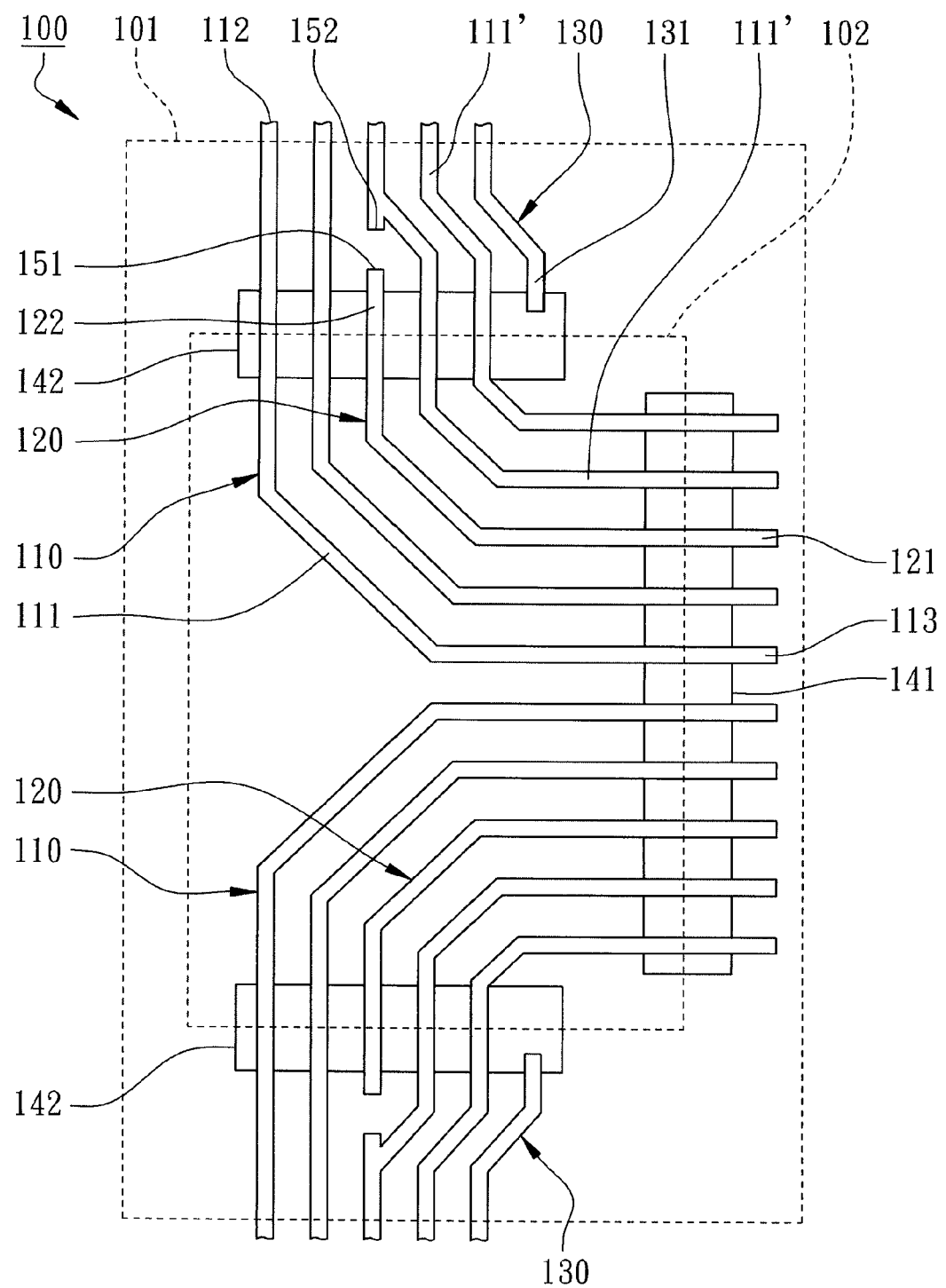
FIG. 7 is a partial top view of another leadframe having isolated inner lead(s) according to the second embodiment of the present invention.
Figure 8:
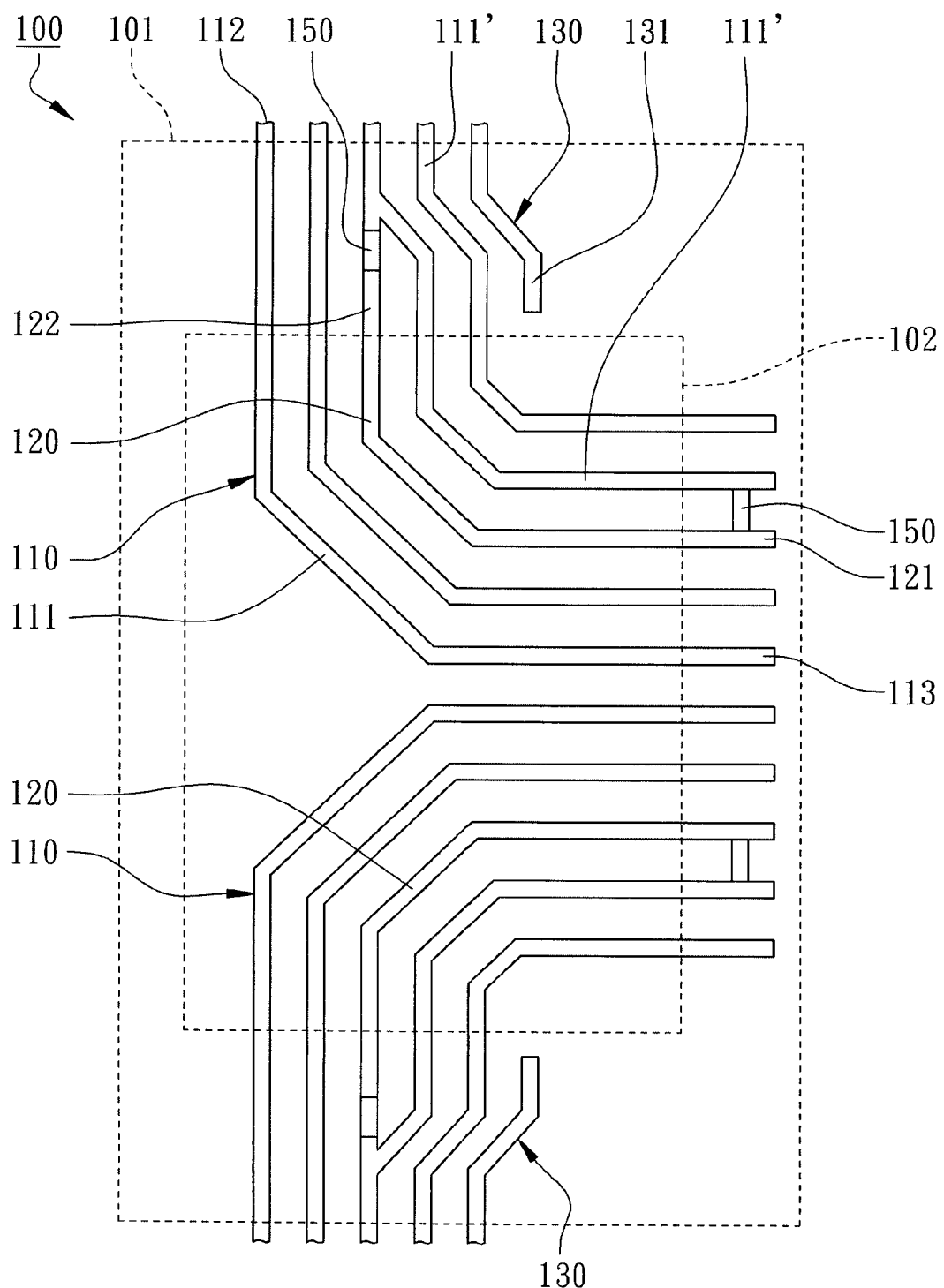
FIG. 8 is a partially top view of the leadframe having isolated inner lead(s) connected with connecting block(s) of the leadframe according to the second embodiment of the present invention.

According to the second embodiment of the present invention, another leadframe having isolated inner leads is illustrated in FIG. 7 for a partial top view and in FIG. 8 for a partial top view before disposing the insulating tapes. A molding area 101 and a die-attaching area 102 disposed inside the molding area 101 are defined on the leadframe 100 where the leadframe 100 comprises a plurality of leads 110, an isolated inner lead 120 and an external lead 130. A first insulating tape 141 and a second insulating tape 142 are attached to the leadframe 100.

Each lead 110 has an inner portion 111 located inside the molding area 101 and an external portion 112 extended outside the molding area 101 where the inner portion 111 and the external portion 112 are integrally connected to each other. A first bonding finger 113 is formed on the inner end of each inner portion 111. The isolated inner lead 120 is completely located inside the molding area 101 and is formed from the same layer of the leadframe with the leads 110 where a second bonding finger 121 and a third bonding finger 122 are formed at two opposing ends of the isolated inner lead 120. The first bonding fingers 113 and the second bonding finger 121 are linearly arranged. In this embodiment, the second bonding finger 121 and the third bonding finger 122 are located within the molding area 101 but outside the die-attaching area 102. The external lead 130 is extended outside the molding area 101 and further partially formed inside the molding area 101 to have a fourth bonding finger 131 located inside the molding are 101. The fourth bonding finger 131 and the third bonding finger 122 are adjacent to each other. Among the inner portions 111, there is at least one inner portion 111' electrically isolated and formed between the isolated inner lead 120 and the external lead 130 to divide the fourth bonding finger 131 from the third bonding finger 122. In the present embodiment, the arranging direction of the third bonding finger 122 and the fourth bonding finger 131 are approximately perpendicular to the linearly arranging direction of the first bonding fingers 113 and the second bonding finger 121. The external portions 112 of the leads 110 are disposed at two opposing parallel sides of the molding area 101. According to the mentioned structure, the short leads can be eliminated to increase the support of the leads to the carried chips. Furthermore, the first insulating tape 141 and the second insulating tape 142 are attached to the isolated inner leads 120 and the inner portions 111 and are located inside the molding area 101 to electrically isolated and mechanically fix the isolated inner lead 120. Therein, the first insulating tape 141 is close to the first bonding fingers 113 and the second bonding finger 121, and the second insulating tape 142 is close to the third bonding finger 122 and the fourth bonding finger 131.

As shown in FIG. 7, after removing an connecting block, the isolated inner lead 120 has a first connecting residue 151 and the inner portions 111' has a second connecting residue 152 corresponding to the first connecting residue 151. The isolated inner lead 120 is mechanically connected to and electrically isolated from the leads 110.

As shown in FIG. 8, before disposing the first insulating tape 141 and the second insulating tape 142 and before removing the connecting block, the isolated inner lead 120 is mechanically connected to the adjacent inner portions 111' by at least one connecting block 150. The connecting block 150 is located inside the molding area 101 but outside the die-attaching area 102 and formed from the same layer with the inner portions 111 to integrally connect the isolated inner lead 120 to the adjacent inner portion 111'. The isolated inner lead 120 is mechanically and electrically connected to the leads 110. After removing the connecting block 150, the first connecting residue 151 and the second connecting residue 152 are formed. Therefore, the isolated inner lead 120 and the leads 110 can be formed in the same metal leadframe with the leads 110 and are electrically isolated and mechanically fixed in the molding area 101 without clamping by the top and bottom mold tools.

The above description of embodiments of this invention is intended to be illustrative but not limiting. Other embodiments of this invention will be obvious to those skilled in the art in view of the above disclosure.

What is claimed is:

1. A method for forming an isolated inner lead from a leadframe, comprising the steps of:
    providing a leadframe having a molding area and a die-attaching area disposed inside the molding area, the leadframe comprising:
        a plurality of leads, each having an inner portion inside the molding area and an external portion extended outside the molding area integrally connected to the inner portion, wherein the inner portion has a first bonding finger at one end thereof;
        at least a predetermined isolated inner lead completely located inside the molding area and formed from the same metal layer with the inner portions, wherein the isolated inner lead has a second bonding finger and a third bonding finger formed at two opposing ends thereof, wherein the first bonding fingers and the second bonding finger are linearly arranged;
        an external lead extended outside the molding area, the external lead further being partially located inside the molding area to have a fourth bonding finger adjacent to the third bonding finger, wherein at least one of the inner portions divides the third bonding finger of the isolated inner lead from the fourth bonding finger of the external lead; and
        a connecting block disposed inside the die-attaching area and formed from the same layer with the inner portions to integrally connect the isolated inner lead to an adjacent one of the inner portions;
    attaching a first insulating tape and a second insulating tape to the leadframe so that the isolated inner lead and the inner portions are mechanically connected together, wherein the first insulating tape is disposed inside the molding area adjacent to the first bonding fingers and the second bonding finger, and wherein the second insulating tape is disposed inside the molding area adjacent to the third bonding finger and the fourth bonding finger, wherein the connecting block is located between the first insulating tape and the second insulating tape; and
    removing the connecting block to make the isolated inner lead electrically isolated from the adjacent inner portion.

2. The method as claimed in claim 1, wherein the first bonding fingers and the fourth bonding finger are located outside the die-attaching area, wherein the isolated inner lead extends a length to pass through the die-attaching area, with the second bonding finger and the third bonding finger located outside the die-attaching area.

3. The method as claimed in claim 2, wherein the first insulating tape and the second insulating tape are located inside the die-attaching area.

4. The method as claimed in claim 1, wherein the leadframe further comprises a plurality of short leads shorter than the leads and not extending into the die-attaching area.

5. The method as claimed in claim 4, wherein the linearly arranging direction of the first bonding fingers and the second bonding finger is parallel to that of the third bonding finger and the fourth bonding finger, with a plurality of internal ends of the short leads pointing to the first bonding fingers and the second bonding finger.

6. The method as claimed in claim 1, wherein the linearly arranging direction of the first bonding fingers and the second bonding finger is perpendicular to that of the third bonding finger and the fourth bonding finger.

7. The method as claimed in claim 6, wherein the external portions of the leads are disposed at two opposing parallel sides of the molding area.

8. The method package as claimed in claim 1, wherein the leadframe further comprises a plurality of side-supporting pads located at two opposing sides of the inner portions of the leads.

9. The method as claimed in claim 8, wherein the side-supporting pads have a plurality of mold-flow through holes.

10. The method as claimed in claim 1, wherein the fourth bonding finger partially extends inside the die-attaching area.

11. The method as claimed in claim 10, wherein the second insulating tape further mechanically connects the fourth bonding finger.

12. The method as claimed in claim 1, wherein at least two of the inner portions have widened sections to form a plurality of first locking pads inside the die-attaching area.

13. The method as claimed in claim 12, wherein the isolated inner lead has a widened section to form a second locking pad inside the die-attaching area.

14. The method as claimed in claim 13, wherein the first locking pads and the second locking pad are linearly arranged.

15. The method as claimed in claim 1, wherein the leadframe further comprises a T-bar located inside the molding area but outside the die-attaching area.

16. A method for forming an isolated inner lead from a leadframe, comprising the steps of:
provided a leadframe having a molding area and a die-attaching area disposed inside the molding area, the leadframe comprising:
a plurality of leads, each having an inner portion inside the molding area and an external portion extended outside the molding area integrally connected to the inner portion, wherein the inner portion has a first bonding finger at one end thereof;
at least a predetermined isolated inner lead completely located inside the molding area and formed from the same metal layer with the inner portions, wherein the isolated inner lead has a second bonding finger and a third bonding finger formed at two opposing ends thereof, wherein the first bonding fingers and the second bonding finger are linearly arranged;
an external lead extended outside the molding area, the external lead further being partially located inside the molding area to have a fourth bonding finger adjacent to the third bonding finger, wherein at least one of the inner portions divides the third bonding finger of the isolated inner lead from the fourth bonding finger of the external lead; and
a connecting block disposed inside the die-attaching area and formed from the same layer with the inner portions to integrally connect the isolated inner lead to an adjacent one of the inner portions, wherein the first bonding fingers and the fourth bonding finger are located outside the die-attaching area, wherein the isolated inner lead extends a length to pass through the die-attaching area, with the second bonding finger and the third bonding finger located outside the die-attaching area;
attaching a first insulating tape and a second insulating tape to the leadframe so that the isolated inner lead and the inner portions are mechanically connected together, wherein the first insulating tape is disposed inside the molding area adjacent to the first bonding fingers and the second bonding finger, and wherein the second insulating tape is disposed inside the molding area adjacent to the third bonding finger and the fourth bonding finger; and
removing the connecting block to make the isolated inner lead electrically isolated from the adjacent inner portion.

17. The method as claimed in claim 16, wherein the first insulating tape and the second insulating tape are located inside the die-attaching area.

18. A method for forming an isolated inner lead from a leadframe, comprising the steps of:
providing a leadframe having a molding area and a die-attaching area disposed inside the molding area, the leadframe comprising:
a plurality of leads, each having an inner portion inside the molding area and an external portion extended outside the molding area integrally connected to the inner portion, wherein the inner portion has a first bonding finger at one end thereof;
at least a predetermined isolated inner lead completely located inside the molding area and formed from the same metal layer with the inner portions, wherein the isolated inner lead has a second bonding finger and a third bonding finger formed at two opposing ends thereof, wherein the first bonding fingers and the second bonding finger are linearly arranged;
an external lead extended outside the molding area, the external lead further being partially located inside the molding area to have a fourth bonding finger adjacent to the third bonding finger, wherein at least one of the inner portions divides the third bonding finger of the isolated inner lead from the fourth bonding finger of the external lead; and
a connecting block disposed inside the die-attaching area and formed from the same layer with the inner portions to integrally connect the isolated inner lead to an adjacent one of the inner portions; wherein the leadframe further comprises a plurality of short leads shorter than the leads and not extending into the die-attaching area, wherein the linearly arranging direction of the first bonding fingers and the second bonding finger is parallel to that of the third bonding finger and the fourth bonding finger, with a plurality of internal ends of the short leads pointing to the first bonding fingers and the second bonding finger;
attaching a first insulating tape and a second insulating tape to the leadframe so that the isolated inner lead and the inner portions are mechanically connected together, wherein the first insulating tape is disposed inside the molding area adjacent to the first bonding finger and the second bonding fingers, and wherein the second insulating tape is disposed inside the molding area adjacent to the third bonding finger and the fourth bonding finger; and
removing the connecting block to make the isolated inner lead electrically isolated from the adjacent inner portion.

19. The method as claimed in claim 18, wherein at least two of the inner portions have widened sections to form a plurality of first locking pads inside the die-attaching area.

20. The method as claimed in claim 19, wherein the isolated inner lead has a widened section to form a second locking pad inside the die-attaching area, wherein the first locking pads and the second locking pad are linearly arranged.

* * * * *